United States Patent
Moon

(10) Patent No.: US 8,471,462 B2
(45) Date of Patent: Jun. 25, 2013

(54) ORGANIC LIGHT EMITTING DIODE DISPLAY

(75) Inventor: Chan-Kyoung Moon, Yongin (KR)

(73) Assignee: Samsung Display Co., Ltd., Yongin, Gyeonggi-Do (KR)

(*) Notice: Subject to any disclaimer, the term of this patent is extended or adjusted under 35 U.S.C. 154(b) by 0 days.

(21) Appl. No.: 13/064,318

(22) Filed: Mar. 18, 2011

(65) Prior Publication Data

US 2011/0291553 A1 Dec. 1, 2011

(30) Foreign Application Priority Data

May 28, 2010 (KR) .................. 10-2010-0050523

(51) Int. Cl.
*H01L 51/52* (2006.01)
(52) U.S. Cl.
USPC ..................................... 313/504; 361/679.01
(58) Field of Classification Search
USPC ............... 257/40, 72, 98–100, 642–643, 759; 313/498–512; 315/169.1, 169.3; 427/58, 427/64, 66, 532–535, 539; 428/690–691, 428/917; 438/26–29, 34, 82, 455, 64–67, 438/106; 445/24–25; 201/701, 706; 361/679.01; 362/543–545, 249.01, 249.02, 800
See application file for complete search history.

(56) References Cited

U.S. PATENT DOCUMENTS

2010/0053854 A1* 3/2010 Nishikawa et al. ...... 361/679.01

FOREIGN PATENT DOCUMENTS

| KR | 10-2002-0077251 A | 10/2002 |
| KR | 10-2003-0001494 A | 1/2003 |
| KR | 10-2009-0093058 A | 9/2009 |
| WO | WO 2009123696 A2 * | 10/2009 |

* cited by examiner

*Primary Examiner* — Donald Raleigh
(74) *Attorney, Agent, or Firm* — Lee & Morse, P.C.

(57) ABSTRACT

An organic light emitting diode (OLED) display including a panel assembly, the panel assembly including an organic light emitting diode; a bezel, the bezel receiving the panel assembly; and a buffer member, the buffer member being attached to a side of the panel assembly and being between the panel assembly and the bezel, wherein the buffer member includes a first area and a second area, the first area having an elasticity greater than an elasticity of the second area.

18 Claims, 13 Drawing Sheets

FIG. 9A

| Classification | | #1 | #2 | #3 | #4 | #5 | #6 | #7 | #8 | #9 | #10 |
|---|---|---|---|---|---|---|---|---|---|---|---|
| 1 Cycle | S4 | | | | | ■ | | | | | |
| | S5 | ■ | | | | | ■ | | ■ | | |
| 2 Cycle | S4 | | | | | | | | | ■ | |
| | S5 | | | | | | | | | | |
| 3 Cycle | S4 | | | ■ | | | | | | | |
| | S5 | | | | | | | | | | |
| 4 Cycle | S4 | | | | | | | | | | |
| | S5 | | ■ | | | | | | | | ■ |
| 5 Cycle | S4 | | | | ■ | | | | | | |
| | S5 | | | | | | | ■ | | | |
| 6 Cycle | S4 | | | | | | | | | | |
| | S5 | | | | | | | | | | |
| 7 Cycle | S4 | | | | | | | | | | |
| | S5 | | | | | | | | | | |
| 8 Cycle | S4 | | | | | | | | | | |
| | S5 | | | | | | | | | | |
| 9 Cycle | S4 | | | | | | | | | | |
| | S5 | | | | | | | | | | |
| 10 Cycle | S4 | | | | | | | | | | |
| | S5 | | | | | | | | | | |
| | Sum | 10 | 35 | 20 | 40 | 0 | 5 | 45 | 5 | 10 | 35 |
| | Average | 20.50 | | | | | | | | | |

FIG. 9B

| Classification | | #1 | #2 | #3 | #4 | #5 | #6 | #7 | #8 | #9 | #10 |
|---|---|---|---|---|---|---|---|---|---|---|---|
| 1 Cycle | S4 | | | | | | | | | | |
| | S5 | | | | | | | | | | |
| 2 Cycle | S4 | | | | | | | | | | |
| | S5 | | | | | | | | | | |
| 3 Cycle | S4 | | | | | | | | | | |
| | S5 | | | | | | | | | | |
| 4 Cycle | S4 | | | | | | | | | | |
| | S5 | | | | | | | | | | |
| 5 Cycle | S4 | | | | | | | | | | |
| | S5 | | | | | | | | | | |
| 6 Cycle | S4 | | | | | | | | | | |
| | S5 | | | | | | | | | | |
| 7 Cycle | S4 | | | | | | | | | | |
| | S5 | | | | | | | | | | |
| 8 Cycle | S4 | | | | | | | | | | |
| | S5 | | | | | | | | | | |
| 9 Cycle | S4 | | | | | | | | | | |
| | S5 | | | | | | | | | | |
| 10 Cycle | S4 | | | | | | | | | | |
| | S5 | | | | | | | | | | |
| | Sum | 100 | 100 | 100 | 100 | 100 | 100 | 100 | 100 | 100 | 100 |
| | Average | 100.00 | | | | | | | | | |

FIG. 9C

| Classification | | #1 | #2 | #3 | #4 | #5 | #6 | #7 | #8 | #9 | #10 |
|---|---|---|---|---|---|---|---|---|---|---|---|
| 1 Cycle | S4 | | | | | | | | | | |
| | S5 | | | | | | | | | | |
| 2 Cycle | S4 | | | | | | | | | | |
| | S5 | | | | | | | | | | |
| 3 Cycle | S4 | | | | | | | | | | |
| | S5 | | | | | | | | | | |
| 4 Cycle | S4 | | | | | | | | | | |
| | S5 | | | | | | | | | | |
| 5 Cycle | S4 | | | | | | | | | | |
| | S5 | | | | | | | | | | |
| 6 Cycle | S4 | | | | | | | | | | |
| | S5 | | | | | | | | | | |
| 7 Cycle | S4 | | | | | | | | | | |
| | S5 | | | | | | | | | | |
| 8 Cycle | S4 | | | | | | | | | | |
| | S5 | | | | | | | | | | |
| 9 Cycle | S4 | | | | | | | | | | |
| | S5 | | | | | | | | | | |
| 10 Cycle | S4 | | | | | | | | | | |
| | S5 | | | | | | | | | | |
| | Sum | 100 | 100 | 100 | 100 | 100 | 100 | 100 | 100 | 100 | 100 |
| | Average | 100.00 | | | | | | | | | |

FIG. 10A

| Classification | | #1 | #2 | #3 | #4 | #5 | #6 | #7 | #8 | #9 | #10 |
|---|---|---|---|---|---|---|---|---|---|---|---|
| 1 Cycle | S4 | | | | | | ■ | | | | |
| | S5 | | ■ | ■ | ■ | | | | | | |
| 2 Cycle | S4 | | | | | | | ■ | ■ | ■ | |
| | S5 | ■ | | | | ■ | | | ■ | | |
| 3 Cycle | S4 | | | | | | | | | | |
| | S5 | | | | | | | | | | |
| 4 Cycle | S4 | | | | | | | | | | |
| | S5 | | | | | | | | | | |
| 5 Cycle | S4 | | | | | | | | | | ■ |
| | S5 | | | | | | | | | | |
| 6 Cycle | S4 | | | | | | | | | | |
| | S5 | | | | | | | | | | |
| 7 Cycle | S4 | | | | | | | | | | |
| | S5 | | | | | | | | | | |
| 8 Cycle | S4 | | | | | | | | | | |
| | S5 | | | | | | | | | | |
| 9 Cycle | S4 | | | | | | | | | | |
| | S5 | | | | | | | | | | |
| 10 Cycle | S4 | | | | | | | | | | |
| | S5 | | | | | | | | | | |
| | Sum | 15 | 5 | 5 | 5 | 15 | 0 | 10 | 15 | 10 | 40 |
| | Average | | | | | 12.00 | | | | | |

FIG. 10B

| Classification | | #1 | #2 | #3 | #4 | #5 | #6 | #7 | #8 | #9 | #10 |
|---|---|---|---|---|---|---|---|---|---|---|---|
| 1 Cycle | S4 | | | | | | | | | | |
| | S5 | | | | | | | ■ | | | |
| 2 Cycle | S4 | | | | | | | | | | |
| | S5 | | | | | | | | | | |
| 3 Cycle | S4 | | | | | | | | | | |
| | S5 | | | | | | | | | | |
| 4 Cycle | S4 | | | | | | | | | | |
| | S5 | | | | | | | | | | |
| 5 Cycle | S4 | | | ■ | | | | | | | |
| | S5 | | | | | | | | | | |
| 6 Cycle | S4 | | | | | | | | | | |
| | S5 | | | | ■ | | | | | | |
| 7 Cycle | S4 | | | | | | | | | | |
| | S5 | | | | | | | | | | |
| 8 Cycle | S4 | | | | | | | | | | |
| | S5 | | | | | | | | | | |
| 9 Cycle | S4 | | | | | | | | | | |
| | S5 | | | | | | | | | | |
| 10 Cycle | S4 | | | | | | | | | | |
| | S5 | | | | | | | | | | |
| | Sum | 100 | 100 | 45 | 55 | 100 | 100 | 5 | 100 | 100 | 100 |
| | Average | | | | | 80.50 | | | | | |

FIG. 10C

| Classification | | #1 | #2 | #3 | #4 | #5 | #6 | #7 | #8 | #9 | #10 |
|---|---|---|---|---|---|---|---|---|---|---|---|
| 1 Cycle | S4 | | | | | | | | | | |
| | S5 | | | | | | | | | | |
| 2 Cycle | S4 | ■ | | | | ■ | | | | | |
| | S5 | | ■ | | | | | | | | |
| 3 Cycle | S4 | | | | | | | | | | |
| | S5 | | | | | | | ■ | | | |
| 4 Cycle | S4 | | | | | | | | | | |
| | S5 | | | | | | | | | | |
| 5 Cycle | S4 | | | | | | | | | | |
| | S5 | | | | | | ■ | | ■ | | |
| 6 Cycle | S4 | | | | | | | | | | |
| | S5 | | | | | | | | | | |
| 7 Cycle | S4 | | | | | | | | | | |
| | S5 | | | | | | | | | | ■ |
| 8 Cycle | S4 | | | | | | | | | | |
| | S5 | | | | | | | | | | |
| 9 Cycle | S4 | | | | | | | | | | |
| | S5 | | | | | | | | | | |
| 10 Cycle | S4 | | | | | | | | | | |
| | S5 | | | | ■ | | | | | | |
| | Sum | 10 | 15 | 100 | 95 | 10 | 40 | 25 | 40 | 100 | 65 |
| | Average | 50.00 | | | | | | | | | |

ORGANIC LIGHT EMITTING DIODE DISPLAY

BACKGROUND

1. Field

Embodiments relate to an organic light emitting diode (OLED) display.

2. Description of the Related Art

An organic light emitting diode (OLED) display is a flat panel display that may be lightweight and slim because it has a self-light emitting characteristic and may not require a separate light source. Particularly, since OLED displays may exhibit desirable characteristics, e.g., low power consumption, high luminance, and high reaction speed, they have been receiving an attention as the next generation display device.

In general, the organic light emitting diode (OLED) display may include a panel assembly including an organic light emitting diode. The organic light emitting diode may include an anode, a cathode, and an organic emission layer. Holes and electrons may be injected from the anode and cathode to form an exciton and light emission may be implemented while the exciton returns to a ground state.

The panel assembly of the organic light emitting diode (OLED) display may be formed by attaching an upper substrate and a lower substrate by using a sealing member and then receiving the attached substrates in a bezel.

The above information disclosed in this Background section is only for enhancement of understanding of the background of the described technology and therefore it may contain information that does not form the prior art that is already known in this country to a person of ordinary skill in the art.

SUMMARY

Embodiments are directed to an organic light emitting diode (OLED) display.

At least one of the above and other features and advantages may be realized by providing an organic light emitting diode (OLED) display including a panel assembly, the panel assembly including an organic light emitting diode; a bezel, the bezel receiving the panel assembly; and a buffer member, the buffer member being attached to a side of the panel assembly and being between the panel assembly and the bezel, wherein the buffer member includes a first area and a second area, the first area having an elasticity greater than an elasticity of the second area.

The first area may have a density greater than a density of the second area.

The density of the first area may be about 0.5 g/cm$^3$ and the density of the second area may be about 0.05 g/cm$^3$.

The first area and the second area may be formed of the same material.

The first area and the second area may include polyurethane or rubber.

The first area and the second area may be formed of different materials.

The first area may include rubber and the second area may include polyurethane.

The first area may be disposed at a center portion of the buffer member and the second area may be disposed along a circumferential portion of the first area.

The second area may be disposed at a center portion of the buffer member and the first area may be disposed along a circumferential portion of the second area.

The second area may also surround an outer portion of the first area.

The buffer member may further include a third area, the third area may have an elasticity greater than an elasticity of the first area.

The third area may have a density greater than a density of the first area, and the first area may have a density greater than a density of the second area.

The first area, the second area, and the third area may be formed of the same material.

At least two areas of the first area, the second area, and the third area may be formed of different materials.

The first area may be disposed at a center portion of the buffer member, the second area may be disposed along a circumferential portion of the first area, and the third area may be disposed along a circumferential portion of the second area.

The second area may also surround an outer portion of the third area.

The second area may be disposed at a center portion of the buffer member, the third area may be disposed along a circumferential portion of the second area, and the first area may be disposed along a circumferential portion of the third area.

The second area may also surround an outer portion of the first area.

BRIEF DESCRIPTION OF THE DRAWINGS

The above and other features and advantages will become more apparent to those of ordinary skill in the art by describing in detail exemplary embodiments with reference to the attached drawings, in which:

FIG. 9A to FIG. 10C illustrate tables showing falling test results of organic light emitting diode (OLED) displays according to a Comparative Example and Examples 1 and 2.

DETAILED DESCRIPTION

Figure 1:
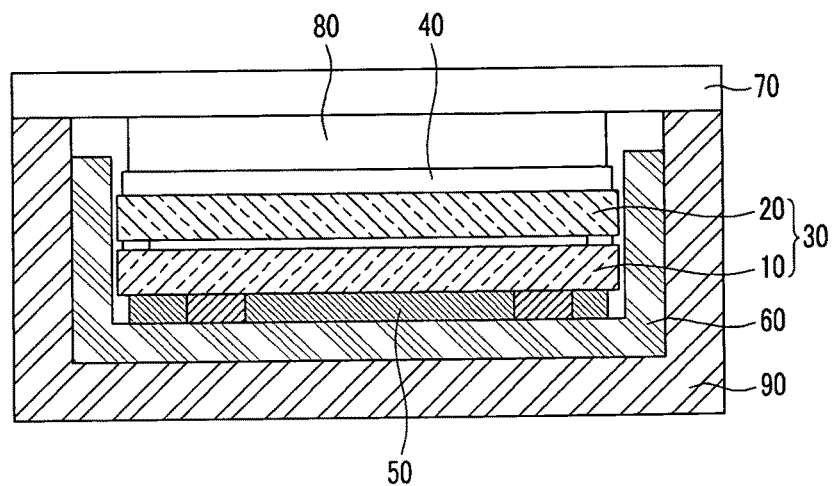
FIG. 1 illustrates a schematic cross-sectional view of an organic light emitting diode (OLED) display according to an embodiment.

Korean Patent Application No. 10-2010-0050523, filed on May 28, 2010, in the Korean Intellectual Property Office, and entitled: "Organic Light Emitting Diode Display," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
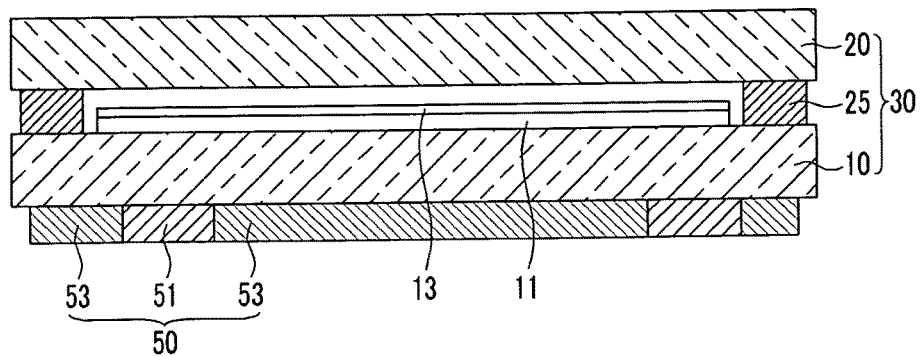
FIG. 2 illustrates an enlarged cross-sectional view of the organic light emitting diode (OLED) display of FIG. 1.

FIG. 1 illustrates a schematic cross-sectional view of an organic light emitting diode (OLED) display according to an embodiment. FIG. 2 illustrates an enlarged cross-sectional view of the organic light emitting diode (OLED) display of FIG. 1. The organic light emitting diode (OLED) display according to the present embodiment will be described with reference to FIGS. 1 and 2.

Referring to FIG. 1 and FIG. 2, the organic light emitting diode (OLED) display according to the present embodiment may include a panel assembly 30 that includes an upper substrate 20, a lower substrate 10 and a sealing member 25. A buffer member 50 may be disposed at a lower portion of the panel assembly 30. The panel assembly 30, a polarizing plate 40, and the buffer member 50 may be received in a bezel 60, which may all then be received in a frame 90. The frame 90 may have a box shape that has an upper portion that is opened. A transparent window 70 may be disposed in the opening of the upper portion; and a resin layer 80 may be disposed between the window 70 and the polarizing plate 40 at an upper portion of the panel assembly 30.

The lower substrate 10 of the panel assembly 30 may be formed of, e.g., glass and the like. On the lower substrate 10, by including electronic elements such as a thin film transistor 11 and the like and an organic light emitting diode 13, light may be emitted by driving the organic light emitting diode 13 by the electronic element. In addition, the upper substrate 20 may face the lower substrate 10 so that the organic light emitting diode 13 may be sealed. The upper substrate 20 may be formed of a transparent material, e.g., glass and the like, so that light generated in the organic light emitting diode 13 may be transmitted therethrough.

The upper substrate 20 and the lower substrate 10 may be attached by the sealing member 25. The sealing member 25 may be also formed of, e.g., glass, and may be formed along edges of the upper substrate 20 and the lower substrate 10. Accordingly, the sealing member may attach both substrates 10 and 20 and may simultaneously protect the organic light emitting diode 13 on the lower substrate 10.

The buffer member 50 may be attached to a lower portion of the panel assembly 30. The buffer member 50 may have, e.g., a double-sided adhesive tape structure, and may be attached between the lower portion of the panel assembly 30 and bezel 60. In order to improve luminance of the display, the polarizing plate 40 may be formed on an upper portion of the panel assembly 30. The bezel 60 for supporting the panel assembly 30 may receive the panel assembly 30, the buffer member 50, and the polarizing plate 40.

The frame 90 may protect the panel assembly 30 and may be formed of, e.g., metal such as aluminum or thermoplastic resin such as polycarbonate (PC). The window 70 that is disposed in the opening of the upper portion of the frame 90 may be formed of a transparent material in order to transmit light emitted from the organic light emitting diode of the panel assembly to an outside thereof. In addition, the resin layer 80 on an upper portion of the polarizing plate 40 may act as a filling agent that fills a space between the window 70 and the polarizing plate 40. The resin layer 80 may be formed of, e.g., a transparent resin, so that light emitted from the organic light emitting diode 13 of the panel assembly 30 may be transmitted therethrough.

In the present embodiment, the buffer member 50 that is disposed at the lower portion of the panel assembly 30 may include a first area 51 and a second area 53. The first area 51 and the second area 53 may have different elasticities. For example, densities of the first area 51 and the second area 53 may be different from each other. Thus, they may have different elasticities.

Referring to FIG. 2, in the present embodiment, the first area 51 of the buffer member 50 may have a density greater than a density of the second area 53. For example, the density of the first area 51 may be about 0.5 g/cm$^3$ and the density of the second area 53 may be about 0.05 g/cm$^3$. However, in the embodiments, the densities and the difference between the densities of the first area 51 and the second area 53 of the buffer member 50 are not particularly limited, but the densities thereof may be selected such that that the first area 51 and the second area 53 have different elasticities.

In the present embodiment, the first area 51 and the second area 53 of the buffer member 50 may be formed of the same material and have different densities. For example, the first area 51 and the second area 53 may be formed of materials including, e.g., polyurethane and/or rubber, and may have different densities. However, the embodiments are not limited thereto; and the first area 51 and the second area 53 of the buffer member 50 may be formed of different materials. For example, the first area 51 may be formed of, e.g., rubber, and the second area 53 may be formed of, e.g., polyurethane.

As described above, the organic light emitting diode (OLED) display according to the present embodiment may suppress breakage of the panel assembly 30 caused by external impact by including the buffer member 50 that is disposed at the lower portion of the panel assembly 30 and including the first area 51 and the second area 53 that have different elasticities.

Figure 3A:
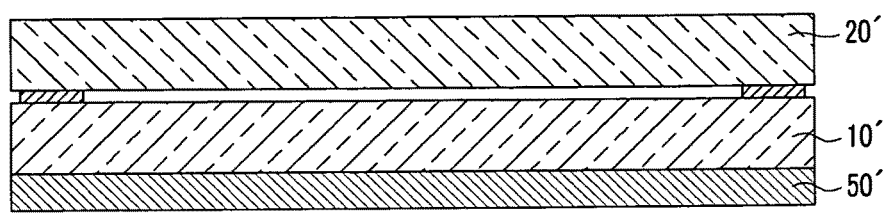
FIG. 3A and FIG. 3B illustrate views schematically showing application of an external impact to an organic light emitting diode (OLED) display according to a Comparative Example.
Figure 3B:
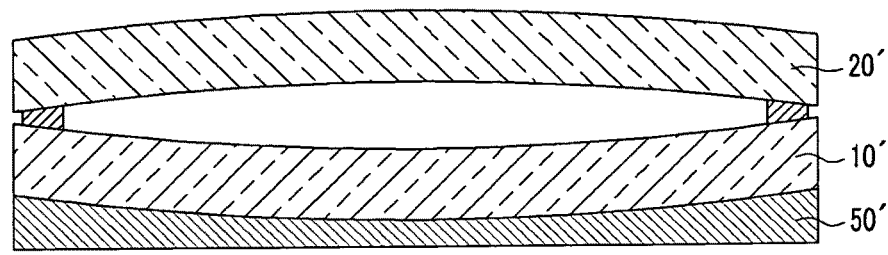
Figure 4A:
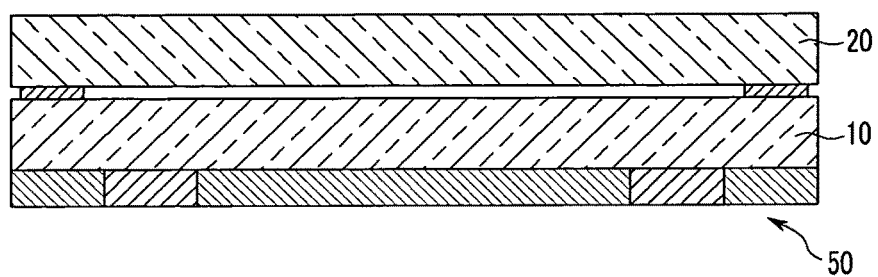
FIG. 4A and FIG. 4B illustrate views schematically showing application of an external impact to the organic light emitting diode (OLED) display of FIG. 1.
Figure 4B:
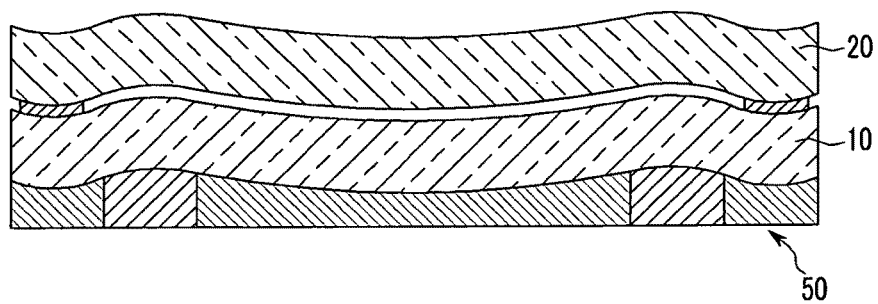

FIG. 3A and FIG. 3B illustrate views schematically showing application of an external impact to the organic light emitting diode (OLED) display according to a Comparative Example. FIG. 4A and FIG. 4B illustrate views schematically showing application of an external impact to the organic light emitting diode (OLED) display of FIG. 1. Effects according to the present embodiment will be described with reference to FIGS. 3A to 4B.

Referring to FIG. 3A, the organic light emitting diode (OLED) display according to the Comparative Example may have a similar structure to the organic light emitting diode (OLED) display according to the present embodiment. However, the buffer member 50' of the Comparative Example may have a uniform elasticity and is thereby different from the organic light emitting diode (OLED) display of an embodiment.

FIG. 3B illustrates the application of external impact to the organic light emitting diode (OLED) display of FIG. 3A through, e.g., falling and the like. In this case, an interval between the upper substrate 20' and lower substrate 10' may be increased from an attachment portion of the upper substrate 20' and lower substrate 10' through an edge portion of the panel assembly, e.g., the sealing member toward a center portion of the panel assembly. The buffer member 50' may have uniform elasticity. Thus, all portions of the substrate may vibrate in the same amplitude. The edge portions of the upper substrate 20' and lower substrate 10' may be attached to each other by the sealing member. Thus, an interval between the substrates may be increased from the edge portion to the center portion.

Accordingly, tensile stress may be excessively applied to the sealing member; and the sealing member formed of the material that is weak to the tensile stress, e.g., glass and the like, may be broken. The upper substrate 20' and lower substrate 10' may be broken by the breakage of the sealing member.

Referring to FIG. 4A and FIG. 4B, the organic light emitting diode (OLED) display according to an embodiment may suppress the breakage of the panel assembly by including the buffer member 50 including the first area and the second area that have different elasticities. When an external impact is applied to the organic light emitting diode (OLED) display according to the present embodiment through, e.g., falling and the like, the elasticity difference of each area of the buffer member 50 may cause a vibration amplitude of the upper substrate 20 and lower substrate 10 to be different. Referring to FIG. 4B, a portion of the substrate on the first area that has high elasticity may have a relatively small vibration amplitude. A portion of the substrate on the second area that has low elasticity may have a relatively large vibration amplitude. An interval between the upper substrate 20 and lower substrate 10 may be almost constantly maintained by the difference of the vibration amplitude of the substrate and the attachment by the sealing member. Accordingly, it is possible to suppress application of the excessive tensile stress to the sealing member, such that it is possible to suppress the breakage of the sealing member and the breakage of the substrate.

Figure 5:
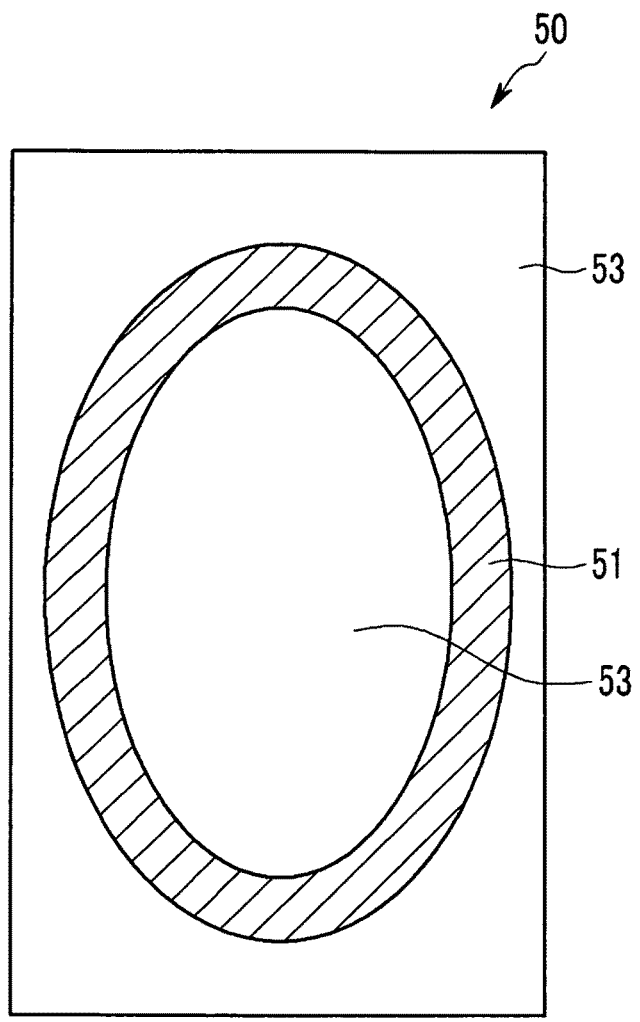
FIG. 5 illustrates a view schematically showing a plane shape of a buffer member of the organic light emitting diode (OLED) display of FIG. 1.

FIG. 5 illustrates a schematic plan view of a plane shape of the buffer member 50 of the organic light emitting diode (OLED) display of FIG. 1. The buffer member 50 according to the present embodiment, as described above, may include the first area 51 and the second area 53. The first area 51 may have a larger elasticity than the second area 53. In the present embodiment, the second area 53 may be formed at a center portion of the buffer member 50, the first area 51 may be formed in a ring form so as to surround the second area 53 at the center portion of the buffer member 50, and the second area 53 may be formed at an outermost portion of the buffer member 50, e.g., surrounding the first area 51.

As described above, the buffer member 50 may be partitioned by the first area 51 and the second area 53 that have different elasticities. The buffer member 50 may suppress breakage of the organic light emitting diode (OLED) display caused by external impact, e.g., falling and the like.

Figure 6:
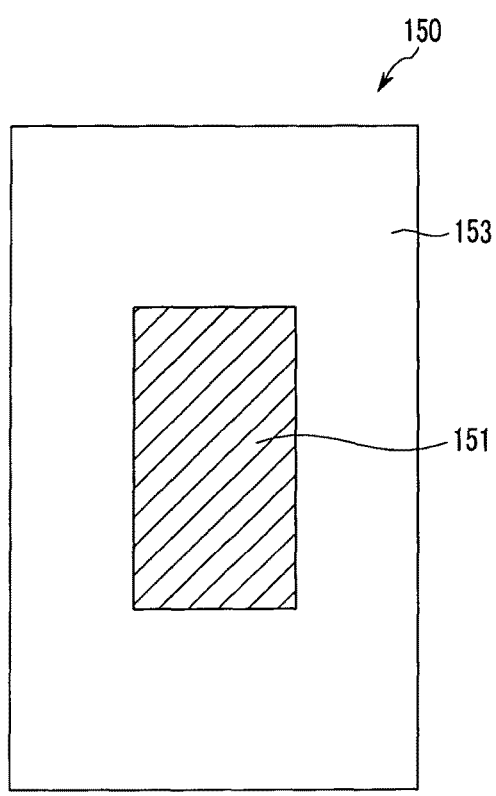
FIG. 6 illustrates a view schematically showing a plane shape of a buffer member of an organic light emitting diode (OLED) display according to another embodiment.
Figure 7:
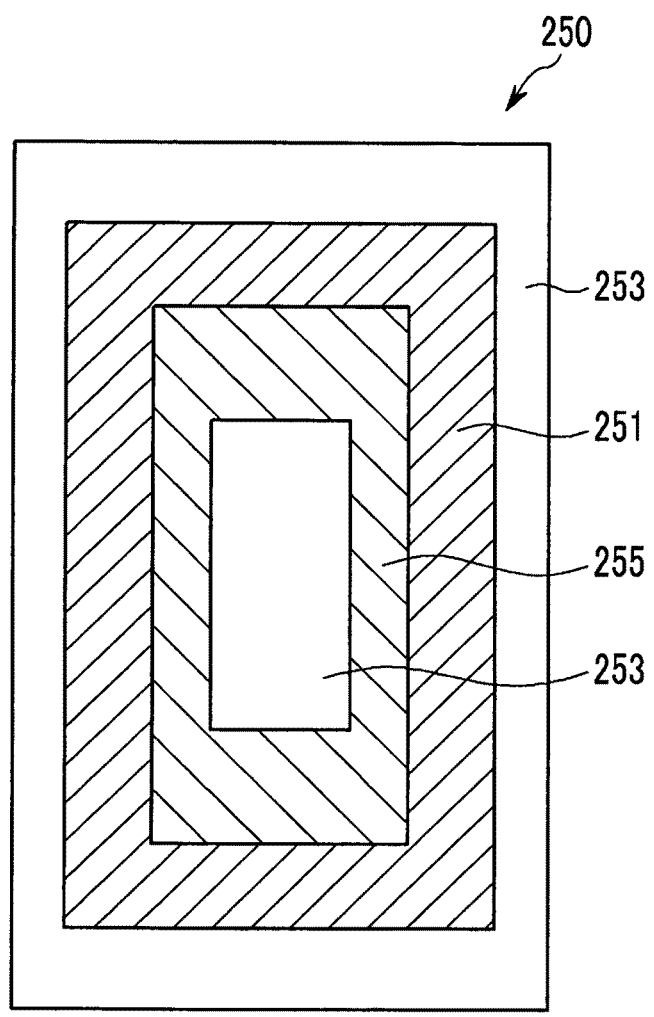
FIG. 7 illustrates a view schematically showing a plane shape of a buffer member of an organic light emitting diode (OLED) display according to yet another embodiment.
Figure 8:
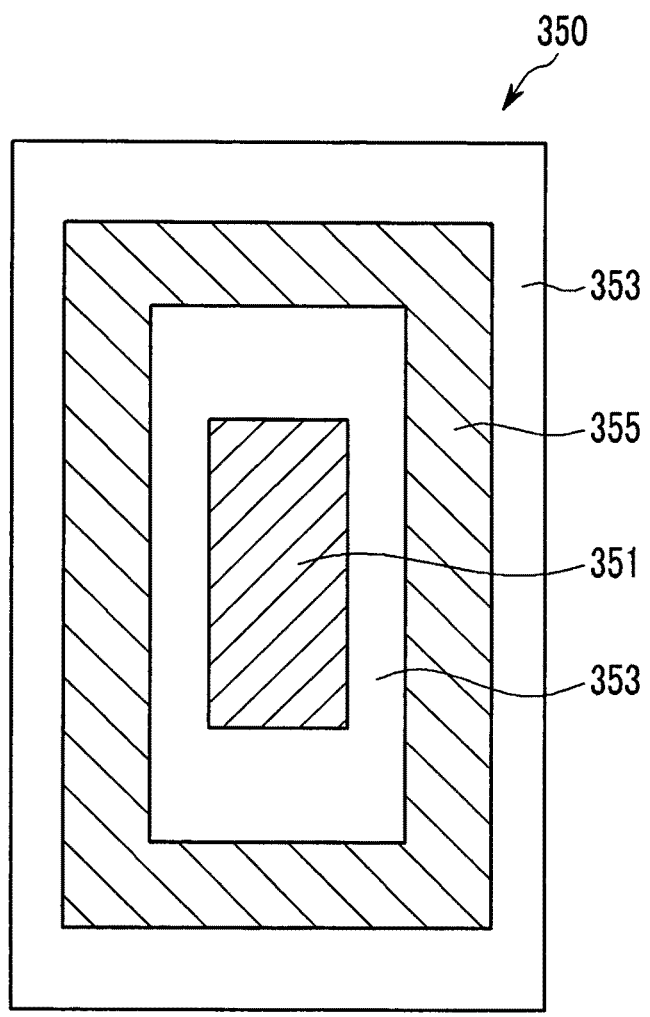
FIG. 8 illustrates a view schematically showing a plane shape of a buffer member of an organic light emitting diode (OLED) display according to still another embodiment.

FIGS. 6 to 8 illustrate views schematically showing a plane shape of buffer members according other embodiments and hereinafter, the other embodiment will be described with reference to FIGS. 6 to 8. In describing the other embodiments, the same configuration as the previous embodiment will be only described in brief or omitted.

FIG. 6 illustrates a view schematically showing a plane shape of a buffer member 150 according to another embodiment. Referring to FIG. 6, the buffer member 150 according to the present embodiment may include the first area 151 and the second area 153. The first area 151 may have a larger elasticity than the second area 153. The first area 151 and the second area 153 may be formed of the same material and may have different densities or may be formed of different materials. For example, the first area 151 and the second area 153 may be formed of any one of, e.g., rubber or polyurethane.

The first area 151 of the buffer member 150 according to the present embodiment may be formed at a center portion of the buffer member 150. The second area 153 may surround the first area 151. When external impact is applied to the organic light emitting diode (OLED) display according to the present embodiment, vibration amplitudes of both substrates may be relatively small at the center portions thereof in which the first area 151 which has the larger elasticity, is disposed at a lower portion thereof. By the above configuration, both substrates may vibrate in a wave form that is similar to that of FIG. 4B, such that it is possible to suppress application of excessive tensile stress to the sealing member. As a result, it is possible to suppress breakage of the organic light emitting diode (OLED) display by external impact.

FIG. 7 illustrates a view schematically showing a plane shape of a buffer member 250 according to yet another embodiment. Referring to FIG. 7, the buffer member 250 according to the present embodiment may further include a third area 255 in addition to the first area 251 and the second area 253. In the present embodiment, the first area 251 may have a larger elasticity than the second area 253; and the third area 255 may have a larger elasticity than the first area 251. The first area 251, the second area 253, and the third area 255 may be formed of the same material and may have different densities. In another implementation, at least two areas of first, second, and third area 251, 253, 255 may be formed of different materials. For example, the first area 251, the second area 253, and the third area 255 may be formed of any one of rubber or polyurethane.

The second area 253 having the smallest elasticity may be formed at a center portion of the buffer member 250 according to the present embodiment. The third area 255 having the largest elasticity may surround the second area 253. In addition, the first area 251 may surround the third area 255. Also, the second area 253 may be formed at an outermost region of the buffer member 250, e.g., surrounding the first area 251. In the organic light emitting diode (OLED) display according to the present embodiment, each area of a lower portion of the substrate may correspond to a region of the buffer member 250 having a different elasticity, such that both substrates may be vibrated in a wave form that is similar to FIG. 4B. Thus, it is possible to suppress application of excessive tensile stress to the sealing member and to suppress breakage of the organic light emitting diode (OLED) display by the external impact.

FIG. 8 illustrates a view schematically showing a plane shape of a buffer member 350 according to still another embodiment. Referring to FIG. 8, the buffer member 350 according to the present embodiment may further include a third area 355 in addition to a first area 351 and a second area 353. In the present embodiment, the first area 351 may have a larger elasticity than the second area 353; and the third area 355 may have a larger elasticity than the first area 351. The first area 351, the second area 353, and the third area 355 may be formed of the same material and may have different densities. In an implementation, at least two areas of the first, second, and third areas 351, 353, 355 may be formed of different materials. For example, the first area 351, the second area 353, and the third area 355 may be formed of any one of rubber or polyurethane.

The first area 351 may be formed at a center portion of the buffer member 350 according to the present embodiment. The second area 353 may surround the first area 351. The third area 355, which may have the largest elasticity, may surround the second area 353. In addition, the second area 353 may be formed at an outermost region of the buffer member 350, e.g., surrounding the third area 355. In the organic light emitting diode (OLED) display according to the present embodiment, each area of the lower portion of the substrate may correspond to a region of the buffer member 350 exhibiting a difference in elasticity such that both substrates may vibrate in a wave form that is similar to FIG. 4B. Therefore, it is possible to suppress application of excessive tensile stress to the sealing member and to suppress breakage of the OLED display by the external impact.

Hereinafter, an effect of a falling test will be described in detail.

FIG. 9A to FIG. 9C and FIG. 10A to FIG. 10C illustrate tables showing falling test results of the organic light emitting diode (OLED) displays according to the Comparative Example and Examples 1 and 2, e.g., the OLED display of FIG. 1, and the OLED display of FIG. 6, respectively.

The OLED displays of Examples 1 and 2 included the buffer member including the first area and the second area configured as illustrated in FIG. 5 and FIG. 6, respectively. Each buffer member was formed of polyurethane, the first area of the buffer member had a density of about 0.5 g/cm$^3$ and the second area had a density of about 0.05 g/cm$^3$. In the Comparative Example, the buffer member had a uniform density of about 0.5 g/cm$^3$.

In the falling test, the results of which are illustrated in FIG. 9A to FIG. 9C, the frame of the organic light emitting diode (OLED) displays were formed of polycarbonate; and falls from a height of 1.3 m to a steel plate having a thickness of 1 cm. One cycle was defined as an alternate falling of a front surface and a rear surface of the organic light emitting diode (OLED) display one time, the falling test was performed for 10 cycles, was performed on 10 samples, and a time at which cracks of the each organic light emitting diode (OLED) display occur was analyzed. The cycle during which the cracks occurred is designated with a black triangle in FIGS. 9A to 9C.

Referring to FIG. 9A to FIG. 9C, in the Comparative Example using the buffer member that has the uniform elasticity, on average, after 2.05 cycles, cracks occurred in the organic light emitting diode (OLED) display. However, in Example 1 and Example 2, even after 10 cycles were performed, cracks did not occur in the organic light emitting diode (OLED) display.

In the falling test of FIG. 10A to FIG. 10C, the frame of the organic light emitting diode (OLED) display was formed of aluminum, and falls from a height of 2.0 m to a steel plate having a thickness of 1 cm were observed. In addition, like the above-described test, one cycle was defined as an alternate falling of a front surface and a rear surface of the organic light emitting diode (OLED) display one time, the falling was performed for 10 cycles, was performed on 10 samples, and a time at which cracks of the each organic light emitting diode (OLED) display occurred was analyzed. The cycle during which the cracks occurred is designated with a black triangle in FIG. 10A to FIG. 10C.

Referring to FIG. 10A to FIG. 10C, in the Comparative Example using the buffer member having a uniform elasticity, on average, after 1.20 cycles, cracks occurred in the organic light emitting diode (OLED) display. However, in Example 1 and Example 2, cracks did not occur in the organic light emitting diode (OLED) display, on average, until after 8.05 cycles and 5.00 cycles were performed, respectively.

By way of overview, a panel assembly of an organic light emitting diode (OLED) display may be formed such that a space may be present therein, unlike a liquid crystal display (LCD) in which liquid crystal fills inside of the panel assembly. Ordinarily, the OLED display may therefore be sensitive to external impact, e.g., falling and the like.

As described above, it is possible to suppress application of excessive tensile stress to the panel assembly of the organic light emitting diode (OLED) display by forming the buffer member of the organic light emitting diode (OLED) display that has a plurality of areas having different elasticities. Therefore, it is possible to form the organic light emitting diode (OLED) display that is resistant to external impact, e.g., falling and the like.

When external impact, caused by e.g., falling or the like, is applied to the organic light emitting diode (OLED) display, direct transmittal of the impact applied to the bezel to the panel assembly may be avoided, thus avoiding breaking of the panel assembly.

Even if the sealing member that attaches the upper substrate and the lower substrate is formed of a material that is weak or sensitive to tensile stress, breaking of the sealing member may be avoided. For example, even if tensile stress is applied to the sealing member according to the vibration of the upper substrate and lower substrate, breaking of the upper substrate and lower substrate may be prevented.

The embodiments provide an organic light emitting diode (OLED) display in which a structure of a buffer member that is attached to a panel assembly is improved.

The embodiments provide an organic light emitting diode (OLED) display having advantages of a buffer function in respects to external impact to improve an impact resistance characteristic.

According to the embodiment, the breakage of the panel assembly may be efficiently suppressed by reducing vibration of the panel assembly by external impact, e.g., falling and the like, by using the buffer member.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting diode (OLED) display, comprising:
   a panel assembly, the panel assembly including an organic light emitting diode;
   a bezel, the bezel receiving the panel assembly; and
   a buffer member, the buffer member being attached to a side of the panel assembly and being between the panel assembly and the bezel,
   wherein:
   the buffer member includes a first area and a second area, the first area having an elasticity greater than an elasticity of the second area,
   the second area is disposed at a center portion of the buffer member and the first area is disposed along a circumferential portion of the second area, and
   the first area has a density greater than a density of the second area.

2. The organic light emitting diode (OLED) display as claimed in claim 1, wherein the density of the first area is about 0.5 g/cm$^3$ and the density of the second area is about 0.05 g/cm$^3$.

3. The organic light emitting diode (OLED) display as claimed in claim 1, wherein the first area and the second area are formed of the same material.

4. The organic light emitting diode (OLED) display as claimed in claim 3, wherein the first area and the second area include polyurethane or rubber.

5. The organic light emitting diode (OLED) display as claimed in claim 1, wherein the first area and the second area are formed of different materials.

6. The organic light emitting diode (OLED) display as claimed in claim 5, wherein the first area includes rubber and the second area includes polyurethane.

7. The organic light emitting diode (OLED) display as claimed in claim 1, wherein the second area also surrounds an outer portion of the first area.

8. The organic light emitting diode (OLED) display as claimed in claim 1, wherein:
the buffer member further includes a third area,
the third area has an elasticity greater than an elasticity of the first area.

9. The organic light emitting diode (OLED) display as claimed in claim 8, wherein:
the third area has a density greater than a density of the first area, and
the first area has a density greater than a density of the second area.

10. The organic light emitting diode (OLED) display as claimed in claim 8, wherein the first area, the second area, and the third area are formed of the same material.

11. The organic light emitting diode (OLED) display as claimed in claim 8, wherein at least two areas of the first area, the second area, and the third area are formed of different materials.

12. An organic light emitting diode (OLED) display, comprising:
a panel assembly, the panel assembly including an organic light emitting diode;
a bezel, the bezel receiving the panel assembly; and
a buffer member, the buffer member being attached to a side of the panel assembly and being between the panel assembly and the bezel,
wherein the buffer member includes a first area, a second area, and a third area, the first area having an elasticity greater than an elasticity of the second area and the third area having an elasticity greater than the elasticity of the first area.

13. The organic light emitting diode (OLED) display as claimed in claim 12, wherein the first area is disposed at a center portion of the buffer member, the second area is disposed along a circumferential portion of the first area, and the third area is disposed along a circumferential portion of the second area.

14. The organic light emitting diode (OLED) display as claimed in claim 13, wherein the second area also surrounds an outer portion of the third area.

15. The organic light emitting diode (OLED) display as claimed in claim 12, wherein the second area is disposed at a center portion of the buffer member, the third area is disposed along a circumferential portion of the second area, and the first area is disposed along a circumferential portion of the third area.

16. The organic light emitting diode (OLED) display as claimed in claim 15, wherein the second area also surrounds an outer portion of the first area.

17. An organic light emitting diode (OLED) display, comprising:
a panel assembly, the panel assembly including an organic light emitting diode;
a bezel, the bezel receiving the panel assembly; and
a buffer member, the buffer member being attached to a side of the panel assembly and being between the panel assembly and the bezel,
wherein:
the buffer member includes a first area and a second area, the first area having an elasticity greater than an elasticity of the second area, and
the first area and the second area are formed of the same material.

18. The organic light emitting diode (OLED) display as claimed in claim 17, wherein the first area is disposed at a center portion of the buffer member and the second area is disposed along a circumferential portion of the first area.

* * * * *